US008957347B2

(12) United States Patent
Yoshikawa et al.

(10) Patent No.: US 8,957,347 B2
(45) Date of Patent: Feb. 17, 2015

(54) METHOD OF DETECTING CONDENSING SPOT POSITION IN LASER BEAM PROCESSING APPARATUS

(75) Inventors: Toshiyuki Yoshikawa, Ota-Ku (JP); Hironari Ohkubo, Ota-Ku (JP); Noboru Takeda, Ota-Ku (JP)

(73) Assignee: Disco Corporation, Tokyo (JP)

(*) Notice: Subject to any disclaimer, the term of this patent is extended or adjusted under 35 U.S.C. 154(b) by 328 days.

(21) Appl. No.: 13/617,046

(22) Filed: Sep. 14, 2012

(65) Prior Publication Data
US 2013/0082038 A1  Apr. 4, 2013

(30) Foreign Application Priority Data

Oct. 4, 2011 (JP) ................. 2011-220368

(51) Int. Cl.
*H01L 21/30* (2006.01)
*H01L 21/304* (2006.01)
*B23K 26/00* (2014.01)
*B23K 26/04* (2014.01)
*B23K 26/40* (2014.01)

(52) U.S. Cl.
CPC .......... *B23K 26/048* (2013.01); *B23K 26/0021* (2013.01); *B23K 26/0042* (2013.01); *H01L 21/3043* (2013.01); *H01L 21/30* (2013.01); *B23K 26/00* (2013.01); *B23K 26/0039* (2013.01); *H01L 21/304* (2013.01); *B23K 26/4075* (2013.01); *H01L 2221/00* (2013.01)
USPC ................. 219/121.62; 219/121.69; 438/463

(58) Field of Classification Search
CPC ... H01L 21/30; H01L 21/304; H01L 21/3043; H01L 2221/00; B23K 26/00; B23K 26/0021; B23K 26/0039; B23K 26/0042

USPC .......... 438/463; 219/121.61, 121.62, 121.68, 219/121.69, 121.78, 121.83; 83/879, 880; 264/400, 482, 157; 65/105
See application file for complete search history.

(56) References Cited

U.S. PATENT DOCUMENTS 8,085,627 B2 * 12/2011 Hashimoto ................ 369/44.26
8,158,493 B2 *  4/2012 Shah et al. ................... 438/463
8,785,813 B2 *  7/2014 Shah et al. ............... 219/121.69

FOREIGN PATENT DOCUMENTS

JP      10-305420       11/1998
JP       3408805         3/2003

* cited by examiner

*Primary Examiner* — Samuel M Heinrich
(74) *Attorney, Agent, or Firm* — Greer Burns & Crain Ltd.

(57) ABSTRACT

A method of detecting a condensing spot position in a laser beam processing apparatus, including: a detection position setting step of setting a plurality of Z-axis directional positions in a range from a starting point to an ending point of detection positions into which the condenser is positioned; a laser beam processed groove forming step of sequentially positioning the condenser into the detection positions in the range from the starting point to the ending point, performing a predetermined interval indexing feeding by operating indexing feeding means each time the detection position for the condenser is changed, and forming a laser beam processed groove of a predetermined length in the plate-shaped body at each of the detection positions for the condenser; and a laser beam processed groove imaging step of imaging the laser beam processed grooves formed in the plate-shaped body by imaging means.

1 Claim, 9 Drawing Sheets

FIG.4

Detection Position

| | Z-axis Position |
|---|---|
| Starting Point | +50μm |
| | +40μm |
| | +30μm |
| | +20μm |
| | +10μm |
| Reference Position | ±0 |
| | −10μm |
| | −20μm |
| | −30μm |
| | −40μm |
| Ending Point | −50μm |

FIG.8

Laser beam Processed Groove Map

| | Z-axis Position | |
|---|---|---|
| Starting Point | +50μm | ▬▬▬▬ |
| | +40μm | ▬▬▬▬ |
| | +30μm | ▬▬▬▬ |
| | +20μm | ▬▬▬ |
| | +10μm | ▬▬ |
| Reference Position | ±0 | ▬▬▬ |
| | −10μm | ▬▬ |
| | −20μm | ─── |
| | −30μm | ─── |
| | −40μm | ▬▬▬ |
| Ending Point | −50μm | ▬▬▬ |

METHOD OF DETECTING CONDENSING SPOT POSITION IN LASER BEAM PROCESSING APPARATUS

BACKGROUND OF THE INVENTION

1. Field of the Invention

The present invention relates to a method of detecting a condensing spot position of a condenser for condensing a laser beam in a laser beam processing apparatus.

2. Description of the Related Art

In a semiconductor device manufacturing process, planned dividing lines called streets are provided in a grid pattern on a surface of a substantially circular plate-shaped semiconductor wafer to partition a plurality of regions, and devices such as ICs or LSIs are formed in the thus partitioned regions. Then, the semiconductor wafer is cut along the streets to divide the regions in which the devices are formed, thereby manufacturing the individual semiconductor devices.

As a method of dividing the semiconductor wafer or the like along the streets, a laser beam processing method has been tried in which the wafer is irradiated with a pulsed laser beam capable of being transmitted through the wafer, while adjusting the condensing point of the laser beam to the inside of the regions to be divided. In the dividing method based on the laser beam processing method, the wafer is irradiated with a pulsed laser beam with such a wavelength as to be transmitted through the wafer, from the side of a surface on one side of the wafer, while adjusting the condensing point of the laser beam to the inside of the wafer, to continuously form an altered layer inside the wafer along the streets, and an external force is exerted on the wafer along the streets where strength is lowered by the formation of the altered layer, to thereby divide the workpiece (refer to, for example, Japanese Patent No. 3408805). In the case of forming the altered layer inside the workpiece along the streets formed on the workpiece in this manner, it is important for the condensing point of the laser beam to be positioned into a position of a predetermined depth from the upper surface of the workpiece.

In addition, as a method of dividing a plate-shaped workpiece such as a semiconductor wafer, a method has been proposed in which the workpiece is irradiated with a pulsed laser beam with such a wavelength as to be absorbed in the workpiece along the streets formed on the workpiece, to form laser beam processed grooves through ablation, and the workpiece is cut up along the laser beam processed grooves by use of a mechanical breaking device (refer to, for example, Japanese Patent Laid-open No. Hei 10-305420). In the case of forming the laser beam processed grooves along the streets formed on the workpiece in this manner, also, it is important for the condensing point of the laser beam to be positioned into a position of a predetermined depth in the workpiece.

SUMMARY OF THE INVENTION

The position of the condensing spot (condensing point) of the laser beam condensed by a condenser for condensing the laser beam is determined by a designed NA value of the condenser. In this case, if the spacing between the condenser and workpiece holding means is not maintained with high accuracy, it may be impossible for the condensing spot to be properly positioned relative to the workpiece held on the workpiece holding means.

Accordingly, it is an object of the present invention to provide a method of detecting a condensing spot position in a laser beam processing apparatus by which the position of a condensing spot of a laser beam condensed by a condenser for condensing the laser beam can be detected properly.

In accordance with an aspect of the present invention, there is provided a method of detecting a condensing spot position in a laser beam processing apparatus including: workpiece holding means provided with a holding surface for holding a workpiece thereon; laser beam irradiation means provided with a condenser for irradiating the workpiece held on the workpiece holding means with a laser beam; processing feeding means for relative processing feed of the workpiece holding means and the laser beam irradiation means in a processing feed direction (X-axis direction); indexing feeding means for relative indexing feed of the workpiece holding means and the laser beam irradiation means in an indexing feed direction (Y-axis direction) orthogonal to the processing feed direction (X-axis direction); condensing point control means for moving the laser beam irradiation means in a direction (Z-axis direction) perpendicular to the holding surface of the workpiece holding means; Z-axis directional position detection means for detecting the Z-axis directional position of the condenser controlled by the condensing point control means; imaging means for imaging the workpiece held on the workpiece holding means; and display means for displaying an image picked up by the imaging means, the method including: a plate-shaped body holding step of holding a plate-shaped body having a predetermined thickness on the holding surface of the workpiece holding means; a reference position setting step of setting a reference position in the Z-axis direction of the condenser according to a designed value of a condensing spot of the laser beam condensed by the condenser and the thickness of the plate-shaped body; a detection position setting step of setting a detection region in excess of a range of errors between the designed value and an actual condensing spot position from the reference position, and setting a plurality of Z-axis directional positions in the range from a starting point to an ending point of detection positions into which the condenser is to be positioned; a laser beam processed groove forming step of sequentially positioning the condenser into the plurality of detection positions in the range from the starting point to the ending point set in the detection position setting step, performing a predetermined interval indexing feeding by operating indexing feeding means each time the detection position for the condenser is changed, and forming a laser beam processed groove of a predetermined length in the plate-shaped body held on the workpiece holding means by operating the laser beam irradiation means and the processing feeding means at each of the detection positions for the condenser; a laser beam processed groove imaging step of imaging the laser beam processed grooves, formed in the plate-shaped body by the laser beam processed groove forming step, by the imaging means; and a laser beam processed groove displaying step of displaying the laser beam processed grooves, imaged by the laser beam processed groove imaging step, on a straight line correspondingly to the detection positions in the range from the starting point to the ending point of the detection positions.

In the method of detecting a condensing spot position in a laser beam processing apparatus according to the present invention, the laser beam processed grooves formed in the plate-shaped body held on the holding surface of the workpiece holding means at the detection positions for the condenser in the range from the starting point to the ending point set in the detection position setting step are displayed on a straight line correspondingly to the detection positions in the range from the starting point to the ending point of the detection positions. Therefore, it is extremely easy to distinguish the thinnest (smallest-width) laser beam processed groove (laser beam processed groove formed by the condensing spot).

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 4 illustrates Z-axis directional positions of detection positions set in a detection position setting step in the method of detecting a condensing spot potion in a laser beam processing apparatus according to the present invention;

FIG. 8 illustrates a laser beam processed groove map which is formed in the method of detecting a condensing spot position in a laser beam processing apparatus according to the present invention.

DETAILED DESCRIPTION OF THE PREFERRED EMBODIMENTS

Figure 1:
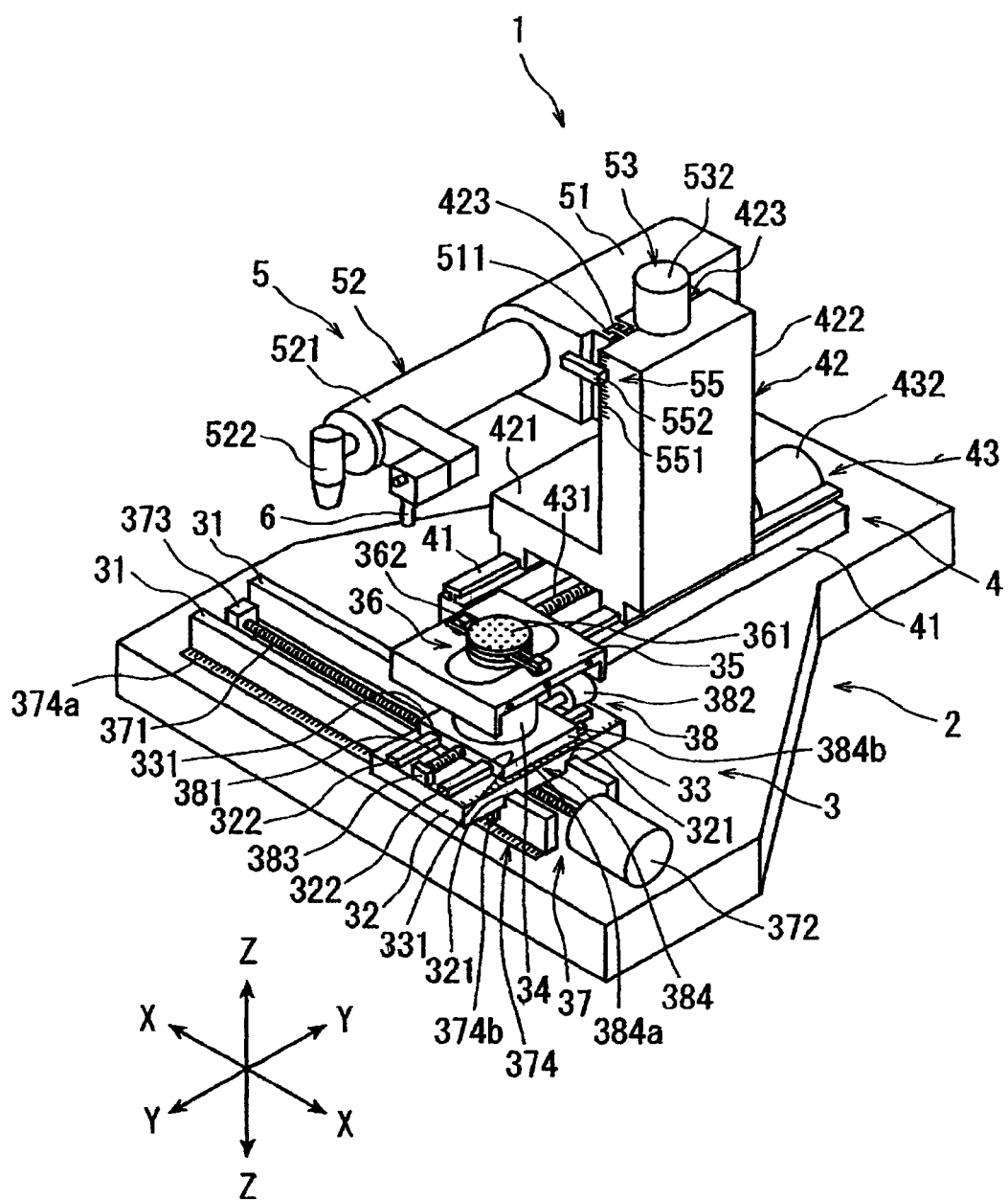
FIG. 1 is a perspective view of a laser beam processing apparatus for carrying out a method of detecting a condensing spot position according to the present invention.

Now, preferred embodiments of the method of detecting a condensing spot position in a laser beam processing apparatus according to the present invention will be described more in detail below, referring to the accompanying drawings. FIG. 1 shows a perspective view of a laser beam processing apparatus for carrying out the method of detecting a condensing spot position according to the present invention. The laser beam processing apparatus 1 shown in FIG. 1 includes: a stationary base 2; a chuck table mechanism 3 which is disposed on the stationary base 2 so as to be movable in a processing feed direction (X-axis direction) indicated by arrow X and which holds a workpiece; a laser beam irradiation unit support mechanism 4 disposed on the stationary base 2 so as to be movable in an indexing feed direction (Y-axis direction) indicated by arrow Y which is orthogonal to the direction (X-axis direction) indicated by arrow X; and a laser beam irradiation unit 5 disposed on the laser beam irradiation unit support mechanism 4 so as to be movable in a condensing point position control direction (Z-axis direction) indicated by arrow Z.

The chuck table mechanism 3 includes: a pair of guide rails 31, 31 disposed on the stationary base 2 in parallel to each other along the processing feed direction indicated by arrow X; a first sliding block 32 disposed on the guide rails 31, 31 so as to be movable in the processing feed direction (X-axis direction) indicated by arrow X; a second sliding block 33 disposed on the first sliding block 32 so as to be movable in the indexing feed direction (Y-axis direction) indicated by arrow Y; a cover table 35 supported on the second sliding block 33 by a hollow cylindrical member 34; and a chuck table 36 as workpiece holding means. The chuck table 36 has a suction chuck 361 formed from a porous material, and a workpiece, for example, a circular disk-shaped semiconductor wafer is held on the suction chuck 361 by suction means (not shown). The chuck table 36 configured as above is rotated by a pulse motor (not shown) disposed inside the hollow cylindrical member 34. Incidentally, the chuck table 36 is provided with clamps 362 for fixing an annular frame which will be described later.

The first sliding block 32 is provided in a lower surface thereof with a pair of guided grooves 321, 321 in which to fit the pair of guide rails 31, 31, and is provided on an upper surface thereof with a pair of guide rails 322, 322 formed in parallel to each other along the indexing feed direction indicated by arrow Y. The first sliding block 32 configured as above can be moved in the processing feed direction indicated by arrow X along the pair of guide rails 31, 31. The chuck table mechanism 3 in the embodiment shown in the figure has processing feeding means 37 by which the first sliding block 32 is moved in the processing feed direction indicated by arrow X along the pair of guide rails 31, 31. The processing feeding means 37 includes a male screw rod 371 disposed in parallel with and between the pair of guide rails 31 and 31, and a drive source such as a pulse motor 372 for rotationally driving the male screw rod 371. Of the male screw rod 371, one end is rotatably supported on a bearing block 373 fixed to the stationary base 2, and the other end is connected, through a transmission, to an output shaft of the pulse motor 372. Incidentally, the male screw rod 371 is screw engaged with a penetrating female screw hole formed in a female screw block (not shown) projectingly provided at a lower surface of a central portion of the first sliding block 32. Therefore, with the male screw rod 371 rotated normally and reversely by the pulse motor 372, the first sliding block 32 is moved along the guide rails 31, 31 in the processing feed direction (X-axis direction) indicated by arrow X.

The laser beam processing apparatus 1 has X-axis directional position detection means 374 for detecting the X-axis directional position of the chuck table 36. The X-axis directional position detection means 374 is composed of a linear scale 374a disposed along the guide rail 31, and a reading head 374b which is disposed on the first sliding block 32 and is moved along the linear scale 374a together with the first sliding block 32. In the embodiment shown in the figure, the reading head 374b of the X-axis directional position detection means 374 sends to control means (described later) a pulse signal containing one pulse per 1 μm. The control means to be described later counts the pulses in the pulse signal inputted thereto, to thereby detect the X-axis directional position of the chuck table 36.

The second sliding block 33 is provided in the lower surface thereof with a pair of guided grooves 331, 331 in which to fit the pair of guide rails 322, 322 provided on the upper surface of the first sliding block 32. With the guided grooves 331, 331 fitted to the pair of guide rails 322, 322, the second sliding block 33 can be moved in the indexing feed direction (Y-axis direction) indicated by arrow Y. The chuck table mechanism 3 in the embodiment shown in the figure is provided with first indexing feeding means 38 for moving the second sliding block 33 in the indexing feed direction (Y-axis direction) indicated by arrow Y along the pair of guide rails 322, 322 provided on the first sliding block 32. The first indexing feeding means 38 includes a male screw rod 381 disposed in parallel to and between the pair of guide rails 322 and 322, and a drive source such as a pulse motor 382 for rotationally driving the male screw rod 381. Of the male screw rod 381, one end is rotatably supported on a bearing block 383 fixed to an upper surface of the first sliding block 32, and the other end is connected, through a transmission, to an output shaft of the pulse motor 382. Incidentally, the male screw rod 381 is screw engaged with a penetrating female screw hole formed in a female screw block (not shown) projectingly provided at a lower surface of a central portion of the second sliding block 33. Therefore, with the male screw rod 381 rotated normally and reversely by the pulse motor 382, the second sliding block 33 is moved along the guide rails 322, 322 in the indexing feed direction (Y-axis direction) indicated by arrow Y.

The laser processing apparatus 1 is provided with Y-axis directional position detection means 384 for detecting the Y-axis directional position of the second sliding block 33. The Y-axis directional position detection means 384 is composed of a linear scale 384a disposed along the guide rail 322, and a reading head 384b which is disposed on the second sliding block 33 and is moved along the linear scale 384a together with the second sliding block 33. In the embodiment shown in the figure, the reading head 384b of the Y-axis directional position detection means 384 sends to the control means (described later) a pulse signal containing one pulse per 1 μm. The control means to be described later counts the pulses in the pulse signal inputted thereto, to thereby detect the Y-axis directional position of the chuck table 36.

The laser beam irradiation unit support mechanism 4 includes a pair of guide rails 41, 41 disposed on the stationary base 2 in parallel to each other along the indexing feed direction (Y-axis direction) indicated by arrow Y, and a movable support bases 42 disposed on the guide rails 41, 41 so as to be movable in the direction indicated by arrow Y. The movable support base 42 is composed of a moving support section 421 movably disposed on the guide rails 41, 41, and an attachment section 422 attached to the moving support section 421. The attachment section 422 is provided on a side surface thereof with a pair of guide rails 423, 423 extending in the direction indicated by arrow Z. The laser beam irradiation unit support mechanism 4 in the embodiment shown in the figure is provided with second indexing feeding means 43 for moving the movable support base 42 along the pair of guide rails 41, 41 in the indexing feed direction (Y-axis direction) indicated by arrow Y. The second indexing feeding means 43 includes a male screw rod 431 disposed in parallel to and between the pair of guide rails 41, 41, and a drive source such as a pulse motor 432 for rotationally driving the male screw rod 431. Of the male screw rod 431, one end is rotatably supported on a bearing block (not shown) fixed to the stationary base 2, and the other end is connected, through a transmission, to an output shaft of the pulse motor 432. Incidentally, the male screw rod 431 is screw engaged with a female screw hole formed in a female screw block (not shown) projectingly provided at a lower surface of a central portion of the moving support section 421 constituting the movable support base 42. Therefore, with the male screw rod 431 rotated normally and reversely by the pulse motor 432, the movable support base 42 is moved along the guide rails 41, 41 in the indexing feeding direction (Y-axis direction) indicated by arrow Y.

The laser beam irradiation unit 5 is provided with a unit holder 51, and laser beam irradiation means 52 mounted to the unit holder 51. The unit holder 51 is provided with a pair of guided grooves 511, 511 in which to slidably fit the pair of guide rails 423, 423 provided on the attachment section 422. With the guided grooves 511, 511 fitted to the guide rails 423, 423, the unit holder 51 is supported so as to be movable in a focal position control direction (Z-axis direction) indicated by arrow Z.

The laser beam irradiation unit 5 is provided with condensing point position control means 53 for moving the unit holder 51 along the pair of guide rails 423, 423 in the focal position control direction (Z-axis direction) indicated by arrow Z. The condensing point position control means 53 includes a male screw rod (not shown) disposed between the pair of guide rails 423, 423, and a drive source such as a pulse motor 532 for rotationally driving the male screw rod. With the male screw rod (not shown) rotated normally and reversely by the pulse motor 532, the unit holder 51 and the laser beam irradiation means 52 are moved along the guide rails 423, 423 in the condensing point position control direction (Z-axis direction) indicated by arrow Z. Incidentally, in the embodiment shown in the figure, when the pulse motor 532 is driven to rotate normally, the laser beam irradiation means 52 is moved upward, and when the pulse motor 532 is driven to rotate reversely, the laser beam irradiation means 52 is moved downward.

The laser beam irradiation unit 5 is provided with Z-axis directional position detection means 55 for detecting the Z-axis directional position of the laser beam irradiation means 52. The Z-axis directional position detection means 55 is composed of a linear scale 551 disposed in parallel to the guide rails 423, 423, and a reading head 552 which is mounted to the unit holder 51 and is moved along the linear scale 551 together with the unit holder 51. In the embodiment shown in the figure, the reading head 552 of the Z-axis directional position detection means 55 sends to the control means (described later) a pulse signal containing one pulse per 1 μm.

The laser beam irradiation means 52 is provided with pulsed laser beam oscillation means (not shown) disposed inside a casing 521, and a condenser 522 which is disposed at the tip of the casing 521 and by which a pulsed laser beam oscillated from the laser beam oscillation means is condensed to irradiate therewith the workpiece held on the chuck table 36 serving as the workpiece holding means.

At a front end portion of the casing 521 constituting the laser beam irradiation means 52, imaging means 6 is disposed which detects a processing region to be laser beam processed by the laser beam irradiation means 52. The imaging means 6 includes illumination means for illuminating the workpiece, an optical system for catching a region illuminated by the illumination means, and an imaging element (CCD) or the like for picking up an image caught by the optical system, and sends an image signal obtained through the imaging to the control means which will be described later.

Figure 2:
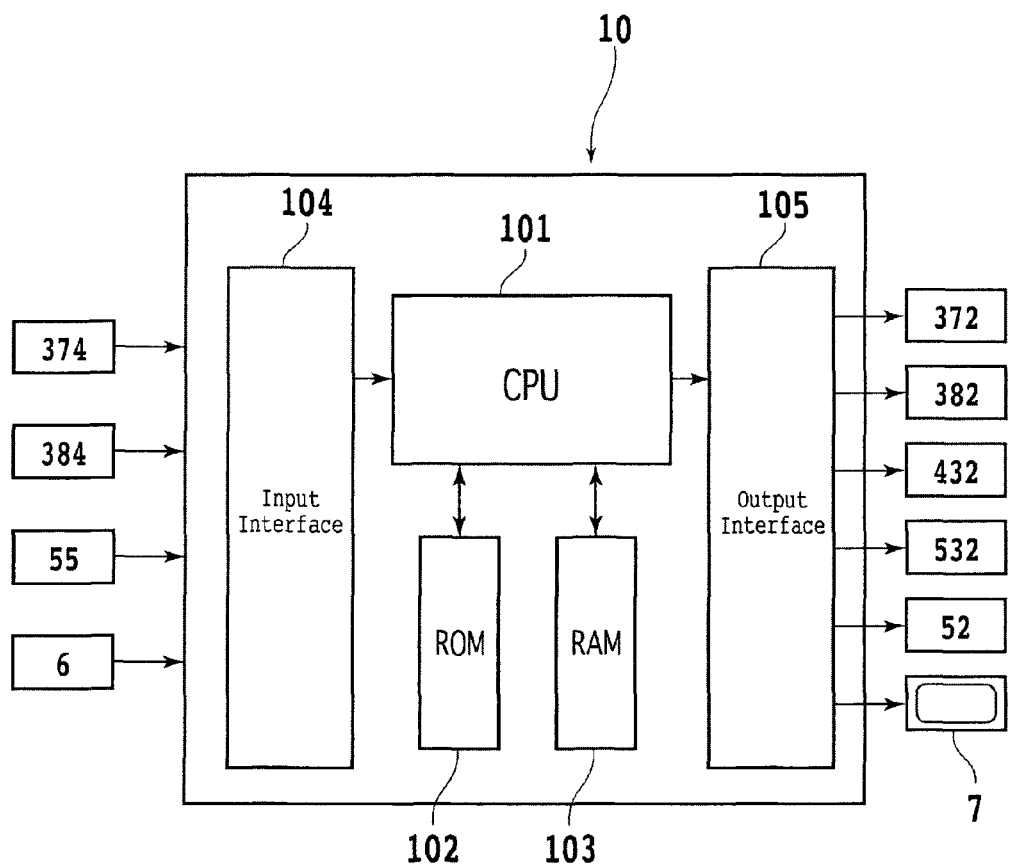
FIG. 2 is a block diagram showing control means provided in the laser beam processing apparatus shown in FIG. 1.

The laser beam processing apparatus 1 has control means 10 shown in FIG. 2. The control means 10 is composed of a computer, and includes a central processing unit (CPU) 101 for computing according to a control program, a read only memory (ROM) 102 for storing the control program and the like, a random access memory (RAM) 103 capable of reading and writing for storing computation results and the like, and an input interface 104 and an output interface 105. Detection signals from the X-axis directional position detection means 374, the Y-axis directional position detection means 384, the Z-axis directional position detection means 55, the imaging means 6 and the like are inputted to the input interface 104 of the control means 10. In addition, control signals are outputted from the output interface 105 of the control means 10 to the pulse motor 372, the pulse motor 382, the pulse motor 432, the pulse motor 532, the laser beam irradiation means 52, a display means 7 and the like.

In the laser beam processing apparatus 1, in connection with the position in the condensing point position control direction (Z-axis direction) (which is the optical axis direction) of the condensing spot of the pulsed laser beam radiated through the condenser 522 of the laser beam irradiation means 52, there is a problem that where the spacing between the condenser 522 and the chuck table 36 as the workpiece holding means is not maintained with high accuracy, the condensing spot cannot be properly positioned relative to the workpiece held on the chuck table 36. Therefore, at the time of starting a laser beam processing operation, it is necessary to detect the position in the condensing point position control direction (Z-axis direction) (which is the optical axis direction) of the condensing spot of the pulsed laser beam radiated through the condenser 522. Now, a method for detecting the position in the condensing point position control direction (Z-axis direction) of the condensing spot of the pulsed laser beam radiated through the condenser 522 will be described below.

Figure 3:
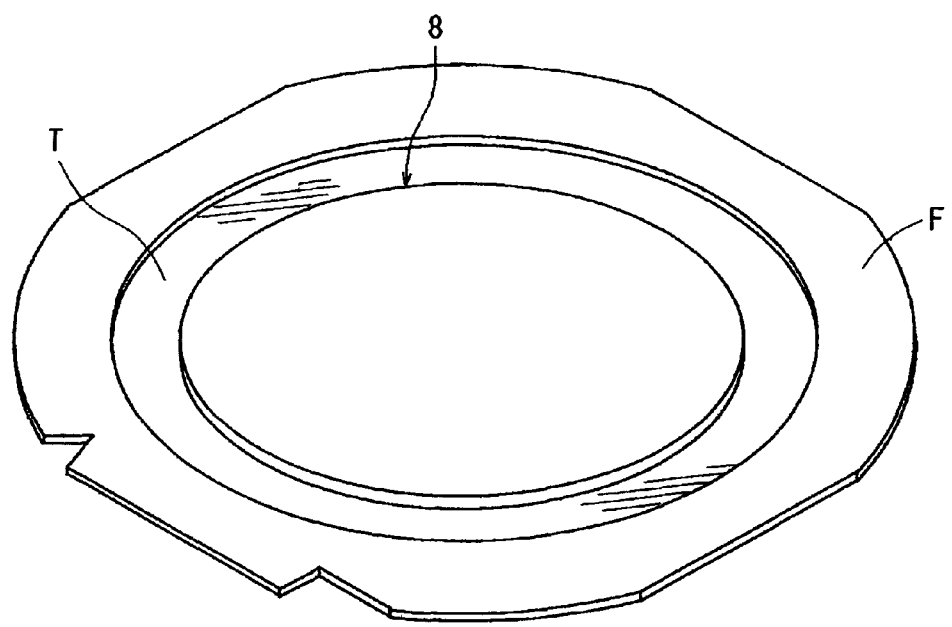
FIG. 3 is a perspective view showing a state wherein a plate-shaped body for use in the method of detecting a condensing spot position in a laser beam processing apparatus according to the present invention is adhered to a pressure sensitive adhesive tape mounted to an annular frame.

In order to carry out the condensing spot position detecting method according to the present invention, first, a plate-shaped body for detection is prepared. In the embodiment shown in the figures, a circular plate-shaped body 8 composed of a silicon substrate having a predetermined thickness is prepared in the state of being adhered to a surface of a pressure sensitive adhesive tape T mounted to an annular frame F, as shown in FIG. 3. The plate-shaped body 8 adhered to the surface of the pressure sensitive adhesive tape T mounted to the annular frame F in this manner is mounted on a holding surface, which is an upper surface of the chuck table 36 as the workpiece holding means of the laser beam processing apparatus 1 shown in FIG. 1, with the pressure sensitive adhesive tape T therebetween. Next, suction means (not shown) is operated, whereby the plate-shaped body 8 is suction held on the chuck table 36, with the pressure sensitive adhesive tape T therebetween (plate-shaped body holding step). Then, the annular frame F is fixed by the clamps 362.

Subsequently, a reference position in the Z-axis direction of the condenser 522 is set according to a designed value of the condensing spot of the laser beam condensed by the condenser 522 and the thickness of the plate-shaped body 8 (as well as the thickness of the pressure sensitive adhesive tape T, in the embodiment shown in the figures) (reference position setting step). Specifically, a reference position is set such that the condensing spot in the designed value of the laser beam condensed by the condenser 522 is positioned on the upper surface of the plate-shaped body 8 suction held via the pressure sensitive adhesive tape T on the chuck table 36 on the basis of a designed value of the focal distance of the condenser 522.

After the reference position setting step; is carried out as above-mentioned, a detection region in excess of a range of an error between the designed value and an actual condensing spot position from the reference position is set, and Z-axis directional positions in the range from a starting point to an ending point of detection positions into which the condenser 522 is to be positioned are set (detection position setting step).

Specifically, if the range of error in regard of the condensing spot position obtained by the condenser 522 is, for example, ±40 μm relative to the reference position, then the detection region is set to be, for example, ±50 μm relative to the reference position, securing an allowance. Besides, the Z-axis directional positions in the range from the starting point to the ending point of the detection positions into which the condenser 522 is to be positioned are set at intervals of, for example, 10 μm, as shown in FIG. 4. The Z-axis directional positions in the range from the starting point (reference position plus 50 μm) to the ending point (minus 50 μm) of the detection position into which the condenser 522 is to be positioned, which are set in the just-mentioned manner, are stored in the random access memory (RAM) 103.

Figure 5A:
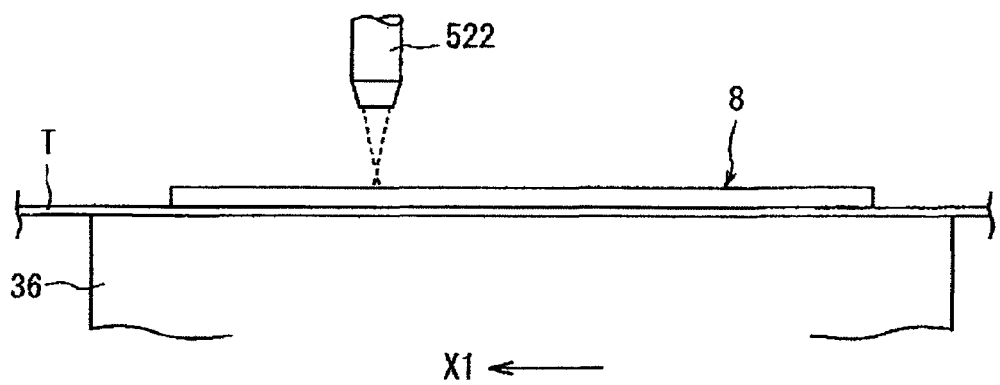
FIGS. 5A and 5B illustrate a laser beam processed groove forming step in the method of detecting a condensing spot position in a laser beam processing apparatus according to the present invention.
Figure 5B:
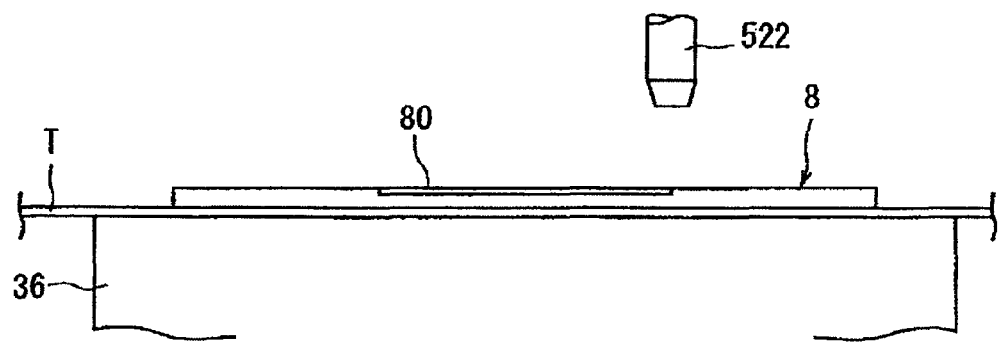

Next, a laser beam processed groove forming step is carried out wherein the condenser 522 is sequentially positioned into the detection positions in the range from the starting point to the ending point set in the detection position setting step, a predetermined interval indexing feeding is conducted by operating the indexing feeding means (in the embodiment shown in the figures, the first indexing feeding means 38) each time the detection position for the condenser is changed, and a laser beam processed groove of a predetermined length is formed in the plate-shaped body 8 held on the chuck table 36 serving as the workpiece holding means by operating the laser beam irradiation means 52 and the processing feeding means 37 at each of the detection positions for the condenser 522. Specifically, as shown in FIG. 5A, the chuck table 36 is moved into a laser beam irradiation region in which the condenser 522 of the laser beam irradiation means 52 for radiating a pulsed laser beam is located, and a laser beam processed groove forming region of the plate-shaped body 8 held on the chuck table 36 is positioned beneath the condenser 522. Then, the Z-axis directional position of the condenser 522 is positioned at the starting position (reference position plus 50 μm) of the detection positions set in the above-mentioned detection position setting step. Next, while a pulsed laser beam of a wavelength (for example, 355 nm) which is absorbable in the plate-shaped body 8 composed of the silicone substrate is being radiated through the condenser 522 of the laser beam irradiation means 52, the processing feeding means 37 is operated to move the chuck table 36 at a predetermined processing feeding rate in the direction indicated by arrow X1 in FIG. 5A (laser beam irradiation step). Then, when the chuck table 36 has been moved by a predetermined distance and the set X-directional position has reached a position beneath the condenser 522 as shown in FIG. 5B, irradiation with the pulsed laser beam is stopped, and the movement of the chuck table 36 is stopped. As a result, the upper surface of the plate-shaped body 8 is formed with a laser beam processed groove 80 having a spot diameter corresponding to the starting point (reference position plus 50 μm) of the detection positions for the condenser 522.

Figure 6A:
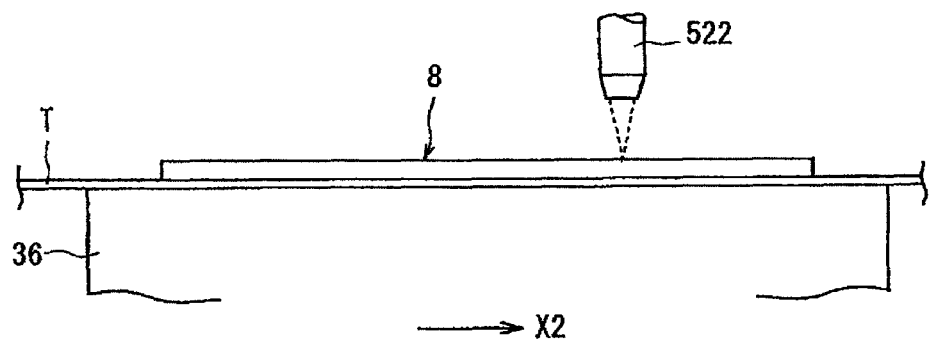
FIGS. 6A and 6B illustrate the laser beam processed groove forming step in the method of detecting a condensing spot position in a laser beam processing apparatus according to the present invention.
Figure 6B:
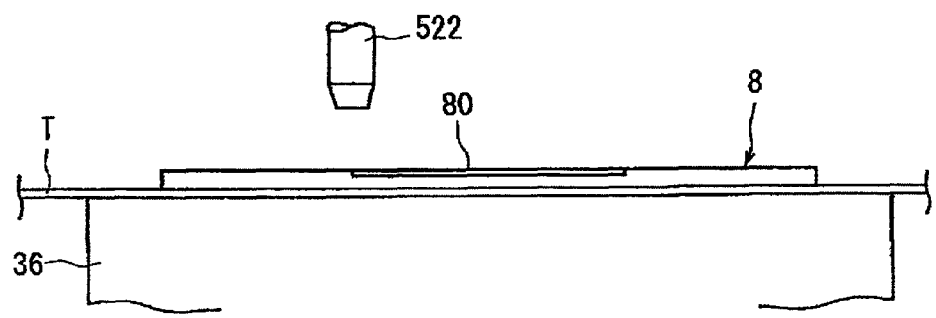

When the condenser 522 is positioned at the starting point position (reference position plus 50 μm) of the detection positions and the laser beam processed groove 80 is formed in the plate-shaped body 8, the first indexing feeding means 38 is operated to make an indexing feeding of the chuck table 36 by, for example, 10 mm in the direction perpendicular to the sheet surface of FIG. 5B, whereby the chuck table 36 is position into the state shown in FIG. 6A. Then, the Z-axis directional position of the condenser 52 is positioned into a second detection position (reference position plus 40 μm) relative to the starting point position of the detection positions set in the above-mentioned detection position setting step. Next, while the pulsed laser beam is being radiated through the condenser 522 of the laser beam irradiation means 52, the processing feeding means 37 is operated to move the chuck table 36 at a predetermined processing feeding rate in the direction indicated by arrow X2 in FIG. 6A (laser beam irradiation step). Then, when the chuck table 36 has been moved by a predetermined distance and the set X-directional position has reached a position beneath the condenser 522, irradiation with the pulsed laser beam is stopped, and the movement of the chuck table 36 is stopped. Consequently, the upper surface of the plate-shaped body 8 is formed with a laser beam processed groove 80 having a spot diameter corresponding to the second detection position (reference position plus 40 μm) relative to the starting point position of the condenser 522.

Figure 7:
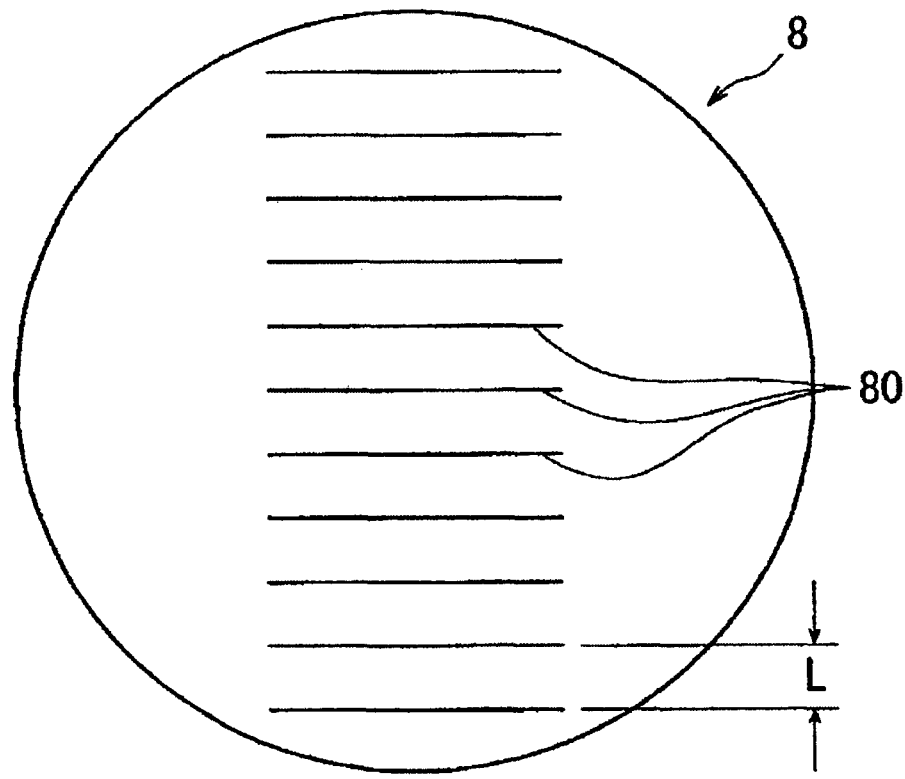
FIG. 7 is a plan view of a plate-shaped body which has undergone the laser beam processed groove forming step in the method of detecting a condensing spot position in a laser beam processing apparatus shown in FIGS. 5A, 5B, 6A and 6B.

Subsequently, the indexing feeding and the positioning of the condenser 522 into each of the detection positions and the laser beam irradiation step are sequentially carried out, and the laser beam processed groove 80 with a spot diameter corresponding to the ending point (reference position minus 50 μm) of the detection positions set in the detection position setting step is formed, whereby the laser beam processed groove forming step is finished. With the laser beam processed groove forming step carried out in this manner, in the embodiment shown in the figures, the upper surface of the plate-shaped body 8 is formed with eleven laser beam processed grooves 80 at an interval (L) of 10 mm as shown in FIG. 7. Incidentally, the interval of the laser beam processed grooves 80 is set to such a value that when one laser beam processed groove 80 is imaged by the imaging means 6 in the laser beam processed groove imaging step (described later) and the image is displayed on the display means 7, the adjacent laser beam processed groove 80 is not displayed.

After the laser beam processed groove forming step is carried out, a laser beam processed groove imaging step is carried out wherein the eleven laser beam processed groove 80 formed in the plate-shaped boy 8 are each imaged by the imaging means 6. Specifically, the chuck table 36 holding thereon the plate-shaped body 8 having been subjected to the laser beam processed groove forming step is position in the imaging region of the imaging means 6. Then, the eleven laser beam processed grooves 80 formed in the upper surface of the plate-shaped boy 8 are sequentially imaged, and an image signal obtained through the imaging is sent to the control means 10.

Figure 9:
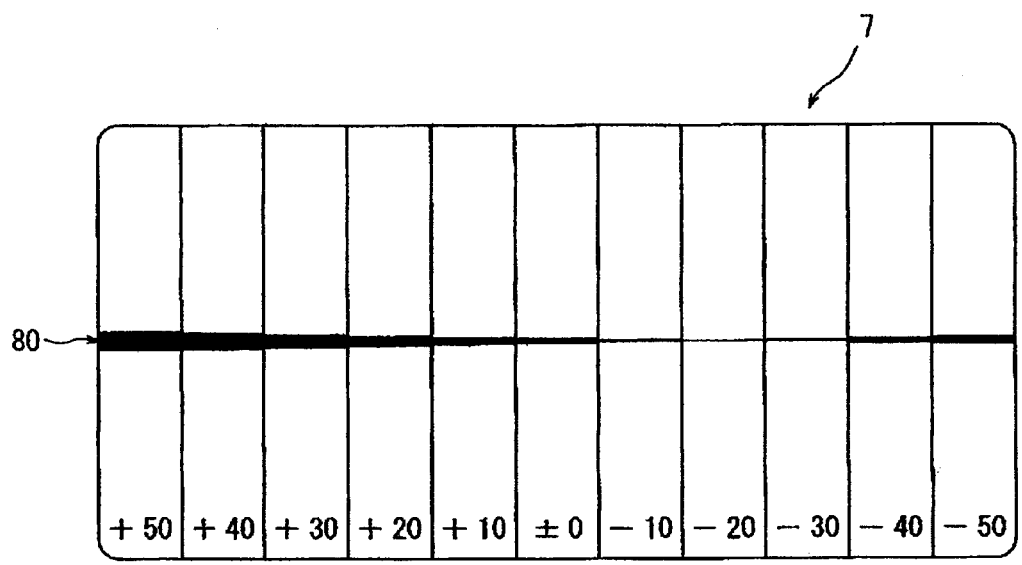
FIG. 9 illustrates laser beam processed grooves displayed on display means in a laser beam processed groove displaying step in the method of detecting a condensing spot position in a laser beam processing apparatus according to the present invention.

When the image signal from the imaging means 6 is inputted to the control means 10, the control means 10 collates the laser beam processed grooves 80 corresponding to the detection positions for the condenser 522 shown in FIG. 4 set in the detection position setting step and stored in the random access memory (RAM) 103, and forms a laser beam processed groove map shown in FIG. 8. When the laser beam processed groove map shown in FIG. 8 is displayed as it is, however, it is not necessarily easy to distinguish the position of the condensing spot. In view of this, in the present invention, based on the data of the laser beam processed groove map shown in FIG. 8, the control means 10 so functions that the laser beam processed grooves 80 corresponding respectively to the detection positions in the range from the starting point (reference position plus 50 μm) to the ending point (reference position minus 50 μm) of the detection positions are displayed on one straight line on the display means 7 as shown in FIG. 9 (laser beam processed groove displaying step). When the laser beam processed grooves 80 corresponding respectively to the detection positions in the range from the starting point (reference position plus 50 μm) to the ending point (reference position minus 50 μm) of the detection positions are thus displayed on one straight line, it is extremely easy to distinguish the thinnest (smallest-width) laser beam processed groove 80 (in the embodiment shown in the figures, the laser beam processed groove 80 corresponding to reference position minus 20 μm). Accordingly, it is easily understood that the position deviated by 20 μm downward from the designed value is the condensing spot position.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of detecting a condensing spot position in a laser beam processing apparatus including: workpiece holding means provided with a holding surface for holding a workpiece thereon; laser beam irradiation means provided with a condenser for irradiating the workpiece held on the workpiece holding means with a laser beam; processing feeding means for relative processing feed of the workpiece holding means and the laser beam irradiation means in a processing feed direction (X-axis direction); indexing feeding means for relative indexing feed of the workpiece holding means and the laser beam irradiation means in an indexing feed direction (Y-axis direction) orthogonal to the processing feed direction (X-axis direction); condensing point control means for moving the laser beam irradiation means in a direction (Z-axis direction) perpendicular to the holding surface of the workpiece holding means; Z-axis directional position detection means for detecting the Z-axis directional position of the condenser controlled by the condensing point control means; imaging means for imaging the workpiece held on the workpiece holding means; and display means for displaying an image picked up by the imaging means, the method comprising:

a plate-shaped body holding step of holding a plate-shaped body having a predetermined thickness on the holding surface of the workpiece holding means;

a reference position setting step of setting a reference position in the Z-axis direction of the condenser according to a designed value of a condensing spot of the laser beam condensed by the condenser and the thickness of the plate-shaped body;

a detection position setting step of setting a detection region in excess of a range of errors between the designed value and an actual condensing spot position from the reference position, and setting a plurality of Z-axis directional positions in the range from a starting point to an ending point of detection positions into which the condenser is to be positioned;

a laser beam processed groove forming step of sequentially positioning the condenser into the plurality of detection positions in the range from the starting point to the ending point set in the detection position setting step, performing a predetermined interval indexing feeding by operating indexing feeding means each time the detection position for the condenser is changed, and forming a laser beam processed groove of a predetermined length in the plate-shaped body held on the workpiece holding means by operating the laser beam irradiation means and the processing feeding means at each of the detection positions for the condenser;

a laser beam processed groove imaging step of imaging the laser beam processed grooves, formed in the plate-shaped body by the laser beam processed groove forming step, by the imaging means; and a laser beam processed groove displaying step of displaying the laser beam processed grooves, imaged by the laser beam processed groove imaging step, on a straight line correspondingly to the detection positions in the range from the starting point to the ending point of the detection positions.

\* \* \* \* \*